United States Patent [19]
Saito et al.

[11] Patent Number: 4,928,010
[45] Date of Patent: May 22, 1990

[54] OBSERVING A SURFACE USING A CHARGED PARTICLE BEAM

[75] Inventors: Kenichi Saito, Isehara; Kou Wada, Kunitachi; Masahiro Yoshizawa, Zama, all of Japan

[73] Assignee: Nippon Telegraph and Telephone Corp.

[21] Appl. No.: 233,612
[22] PCT Filed: Nov. 13, 1987
[86] PCT No.: PCT/JP87/00880
  § 371 Date: Jul. 25, 1988
  § 102(e) Date: Jul. 25, 1988
[87] PCT Pub. No.: WO88/04104
  PCT Pub. Date: Jun. 2, 1988

[30] Foreign Application Priority Data

Nov. 28, 1986 [JP] Japan .............................. 61-283868
Oct. 21, 1987 [JP] Japan .............................. 62-263968

[51] Int. Cl.$^5$ .............................................. H01J 37/26
[52] U.S. Cl. ............................ 250/310; 250/396 ML; 250/397
[58] Field of Search ................ 250/309, 310, 396 ML, 250/397; 313/361.1

[56] References Cited

U.S. PATENT DOCUMENTS

| | | | |
|---|---|---|---|
| 4,209,701 | 6/1980 | Dietrich et al. | 250/396 ML |
| 4,658,136 | 4/1987 | Ohtaka et al. | 250/310 |
| 4,740,698 | 4/1988 | Tamara et al. | 250/310 |

FOREIGN PATENT DOCUMENTS

| | | | |
|---|---|---|---|
| 0138610 | 4/1985 | European Pat. Off. | |
| 52-52562 | 4/1977 | Japan | |
| 57-4379 | 1/1982 | Japan | |
| 0130044 | 7/1985 | Japan | 250/310 |

OTHER PUBLICATIONS

Patent Abstracts of Japan, vol. 11, No. 304 (E-545;) 2751, Oct. 3, 1987 & JP 62-097 246 (Mitsubishi Electric Corp.).
Electron Microscopy, 4th European Regional Conference, Sep. 1968, pp. 353-354, Fourth European Regional Conference on Electron Microscopy, etc.
Patent Abstracts of Japan, vol. 9, No. 288 (E358) 2011, Nov. 15, 1985, and JP 60 130 044 (Nippon Denshi K.K. Jul. 11, 1985 (Abstract).
"Modes S-6000 Field Emission CD Measurement SEM" the 93th study reference disclosed at the 132th committee held on Japan Society for the Promotion of Science (Nov. 8-9, 1985), no translation.
"Low-energy-electron ray tracing its application" the 97th study reference disclosed at the 132th committee held on Japan Society for the Promotion of Science (Nov. 14-15, 1986), no translation.
Electron ray tracing with high accuracy, Kenichi Saito et al., pp. 1913-1917.

Primary Examiner—Bruce C. Anderson

[57] ABSTRACT

An arrangement for observing a surface using a charged particle beam irradiated on the surface of a specimen and detecting secondary electrons emitted. An exciting device produces a strong magnetic field substantially perpendicular to the surface of the specimen. Secondary electrons are extracted from a bottom or side surface of a recess, such as a through hole formed in the surface of the specimen, by an interaction between the emitted secondary electrons and the strong magnetic field. A focusing lens is arranged so as to focus the charged particles at a point on the specimen, even in the presence of a strong field. Thus, a secondary electron image on the surface of the specimen can be sharply obtained to thereby observe a secondary electron image at the bottom surface or side surface of the through hole.

23 Claims, 18 Drawing Sheets

OBSERVING A SURFACE USING A CHARGED PARTICLE BEAM

BACKGROUND OF THE INVENTION

1. Field of the Art

The present invention relates to an apparatus adapted for observing an image composed of secondary electrons generated in a recessed portion when the charged particle beam is focused on a specimen having recessed portions, such as through holes formed in the processes carried out in an LSI production line, and a method for observing a surface by a charged particle beam.

2. Background of the Prior Art

Recently, there has arisen the problem of disconnection in wiring due to the residue of a photoresist on the bottom of a specimen having through holes, capacitive grooves, recesses and so on (all of which are referred to simply as "through holes" hereinafter in this specification) so that there has been a strong demand for an apparatus capable of observing the bottoms of through holes by a charged particle beam in the LSI production process.

FIG. 1 shows a column of an apparatus for observing a surface by utilizing a charged particle observation reported by Y. Furuya, T. Ohtaka, S. Yamada, H. Mori, M. Yamada, T. Watanabe and K. Ishikawa in "Model S-6000 Field Emission CD Measurement SEM", the 93rd study reference disclosed at the 132nd committee held on Japan Society for the Promotion of Science (November 8–9, 1985), p. 1.

Electrons 1 (to be referred to as "the primary electrons" hereinafter in this specification) emitted from a cathode 2 are accelerated by a first anode 3 and a second anode 4 and are focused on the upper surface of a specimen 8 through a condenser lens 5 and an objective lens 6. The focusing point on the surface of the specimen 8 at which the primary electrons 1 are focused is controlled by a deflection coil 7. Secondary electrons 9 produced in response to the impingement of the primary electrons 1 on the surface of the specimen 8 pass through the objective lens 6 and are detected by a secondary electron detector 10. The secondary electron image over the surface of the specimen 8 can be observed with the secondary electron detector 10 by detecting the secondary electrons 9 while the primary electrons 1 are caused to scan the surface of the specimen by using the deflection coil 7.

However, in order to observe the through holes with the above-mentioned conventional apparatus utilizing charged particle beam observation, almost all the secondary electrons emitted from the bottoms of through holes will not come out therefrom because the secondary electrons impinge the side walls of through holes. For instance, the trajectory of the secondary electrons emitted from a cylindrical through a hole 1 $\mu$m in depth and 0.5 $\mu$m in diameter is shown in FIG. 2. An insulating layer 12 is formed over the surface of a substrate 11 and the specimen 8 shown in FIG. 1 is composed of the substrate 11 and the insulating layer 12. The insulating layer 12 is formed with a through hole 0.5 $\mu$m in diameter (D) and 1 $\mu$m in depth (T). Corresponding to the following reference numerals: 13 represents the central axis of the through hole; 14 represents the trajectory of the secondary electron emitted at an angle of 5° with respect to the central axis 13 from the center of the through hole; 15 represents the trajectory of the secondary electron emitted at an angle of 10° with respect to the central axis 13 from the center of the through hole; and 16 represents the trajectory of the secondary electron emitted from the center of the through hole at an angle between 15° and 85° with respect to the central axis 13. The energy of the secondary electrons 14–16 is 5 eV. In the through hole, there exists magnetic flux of $1 \times 10^4$ AT/m corresponding to the leakage flux of the objective lens 6 in parallel with the axis 13. It is seen that the secondary electrons emitted at angles in excess of about more than 15° with respect to the axis 13 impinge on the side wall of the through hole and cannot come out therefrom. As described above, in the case of the conventional apparatus utilizing charged particle beam, almost all the secondary electrons cannot reach the secondary electron detector so that there is the problem that the secondary electron image at the bottom of the through hole cannot be observed.

The same inventors proposed to observe the secondary electrons by applying a strong magnetic field perpendicular to the bottom of the through hole and causing the secondary electrons to come out of the through hole by winding the secondary electrons around lines of the magnetic force as disclosed in "Low-energy-electron ray tracing and its application" in the 97th study reference (November 14–15, 1986) of the 132nd committee held on Japan Society for the Promotion of Science, pp. 118–123. In order to observe the secondary electron image at the bottom of the through hole formed during the LSI production process, it is estimated that the magnetic field of about higher than $10^6$ AT/m must be applied perpendicularly to the surface of the specimen.

In the case of the apparatus as shown in FIG. 1, the magnetic field applied perpendicularly to the surface of the specimen 8 is of the order of about $1 \times 10^4$ AT/m. In order to observe the bottom of the through hole by the above-mentioned method for applying a strong magnetic field to draw the secondary electrons, the magnetic field applied to the specimen 8 must be increased by about 100 times so that the excitation current of the objective lens 7 must be increased also of the order of about 100 times.

However, in the above-mentioned surface observation apparatus utilizing a charged particle beam, when the excitation current for the objective lens 6 is increased, the focusing point of the primary electrons which has been located on the surface of the specimen 8 is moved upwardly so that the secondary electron image of the specimen becomes out of focus as shown in FIG. 3. In FIG. 3, corresponding to the following reference numerals 1 represents the trajectory of the primary electrons prior to the increase of the excitation current for the objective lens 6; 17 represents a point at which the primary electrons 1 converge; 18 represents a trajectory of the primary electrons after the excitation current for the objective lens 6 is increased; and 19 represents the point of convergence or focusing point of the primary electrons when the excitation current is increased. Before the excitation current for the objective lens 6 is increased, the focusing point 17 is at the upper surface of the specimen 8, but when the excitation current for the objective lens 6 is increased, the focusing point 19 of the primary electrons shifts upwardly of the specimen 8. As a result, the diameter of the primary electron beam impinged on the surface of the specimen 8 is increased so that there is the problem that the secondary electron image to be observed becomes out of focus.

DISCLOSURE OF THE INVENTION

The present invention was made to overcome the above and other problems encountered in the conventional apparatus and methods.

One of the object of the present invention is, therefore, to provide an apparatus for observing a surface by utilizing a charged particle beam which can permit the observation of a secondary electron image emitted from the bottom of a recess such as a through hole formed in the surface of a specimen.

Another of the present invention is to provide a method for observing a surface by a charged particle beam in order to obtain a sharp secondary electron image on the surface of a specimen.

In order to achieve the object of the present inveniton, an apparatus for observing a surface utilizing a charged particle beam comprises:

a charged particle gun for emitting charged particles;

a charged particle beam irradiation trajectory control unit for irradiating a specimen with the charged particle beam and scanning the same;

a secondary electron detector for detecting the secondary electrons emitted from the specimen in response to the irradiation of the specimen by the charged particle beam;

a exciting device for producing a strong magnetic field over the surface of the specimen; and a focusing lens for controlling a position at which the charged particles are converged.

Here, the charged particles may be electrons.

The exciting device may apply a strong magnetic field to the surface of the specimen in the direction in which the lines of magnetic force intersect the bottom surface or the side surface of a recess in the surface of the specimen. In this manner, the secondary electrons emitted from the bottom or the side surface of the recess in the surface of the specimen by the irradiation of the charged particle beam make a spiral motion along the strong magnetic field produced by the exciting device, whereby the secondary electrons are emitted out of the recess in the surface of the specimen.

The exciting device may comprise a coil and a magnetic path, and the coil may be cooled by a cooling medium.

The exciting device may comprise at least one superconducting coil, made of a superconducting material and may be enclosed in a casing made of a superconducting material having an air gap at a position in opposing relationship with the specimen. Futher, the superconducting coils may be disposed upwardly and downwardly of the specimen.

The focusing lens may be disposed in such a way that when charged particles each having substantially the same energy as the charged particle are imaginarily emitted from the surface of the specimen, the converging points of the charged particles each having the same energy are defined between the focusing lens and the specimen.

In the first aspect of the method according to the present invention, a method for observing a surface using a charged particle beam comprises the steps of:

emitting the secondary electrons from the bottom or side surface of a recess in the surface of a specimen by irradiating charged particles to the surface of the specimen in the direction in which the lines of magnetic force intersect the bottom or side surface by exciting means;

causing the spiral motion of the second electrons along the strong magnetic field produced by the exciting means;

thereby emitting the secondary electrons from a recess in the surface of the specimen to the exterior thereof and observing the surface including the bottom surface or side surface of the recess of the specimen by the detection of the emitted secondary electrons.

Here, the charged particles may be electrons.

In the second aspect of the method according to the present invention, a method for observing a surface using a charged particle beam comprises the steps of:

in the case of irradiating charged particles over the surface of a specimen and observing an image of secondary electrons emitted from the bottom surface or side surface of a recess in the surface of the specimen, previously obtaining the positions of the imaginary converging points of the charged particles which are defined by imaginarily emitting charged particles each having substantially the same energy of the charged particle with respect to a magnetic field produced by exciting means for applying a strong magnetic field over the surface of the specimen;

causing the spiral motion of the secondary electrons emitted from the bottom surface or side surface of the recess in response to the irradiation of the charged particles thereon along a strong magnetic field produced by the exciting means, thereby causing the secondary electrons to be emitted out of the recess in the surface of the specimen to the exterior; and selecting a value of the excitation current or the voltage applied to focusing means so that the charged particles are converged at the positions of the imaginary converging points, whereby the secondary electrons are detected.

Here, the imaginary converging points may be located between the focusing means and the specimen.

The charged particles may be electrons, and the charged particle beam may be able to scan the surface of the specimen.

The exciting means may comprise a magnetic path and a coil, cooled by a cooling medium.

The exciting means may comprise at least one superconducting coil, made of a superconducting material and may be enclosed in a casing which is made of a superconducting material and has an air gap only at a position in opposing relationship with the specimen, and further, the superconducting coils may be disposed upwardly and downwardly of the specimen.

DETAILED DESCRIPTION OF THE PREFERRED EMBODIMENT

When a strong magnetic field is applied perpendicularly to the surface of a specimen, secondary electrons emitted therefrom make a spiral motion along the magnetic field. In this case the Larmor radius Rc of a secondary electron in spiral motion (that is, the trajectory of the secondary electron reflected with the surface of specimen) is expressed as follows:

$$Rc = (2mE)^{\frac{1}{2}} \sin \theta / (e\mu_0 H) \quad (1)$$

where
H: strength of the magnetic field;
E: the energy of a secondary electron;
m: the mass of an electron;
$\theta$: the emission angle of a secondary electron with respect to a reference direction perpendicular to the surface of the specimen;

e: elementary electric charge; and
$\mu_0$: permeability in vacuum.

In general, a through hole is substantially in the form of a cube or a cylinder. When the through hole is cut by a surface in parallel with the surface of the specimen, a configuration (which is a square in the case of a through hole formed by a cube or a circle in the case of a through hole formed by a cylinder) is obtained. When the diameter of the inscribed circle for the above configuration is represented by Dt, the condition under which a secondary electron is emitted from the bottom of the through hole at an angle $\theta$ with respect to the central axis thereof is obtained as follows by the geometrical analysis:

$$Dt > 4Rc \quad (2)$$

Rewriting Eq. (2) in terms of the relationship between, H and Dt, following equation is obtained.

$$H > 4(2mE)^{\frac{1}{2}} \sin \theta / (e\mu_0 Dt) \quad (3)$$

In order to observe the secondary electron image at the bottom of the through hole, almost all the secondary electrons emitted from the bottom of the through hole must come out of the through hole. That is, under the condition that substituting the emission angle $\phi$ (which is dependent on the size Dt, the depth of a through hole, and in general, is within an angular range between 45° and 90°) at which almost all the secondary electrons are emitted out of the through hole into Eq. (3) as $\theta$ to obtain the following equation:

$$H > 4(2mE)^{\frac{1}{2}} \sin \phi / (e\mu_0 Dt) \quad (4)$$

Figure 4:
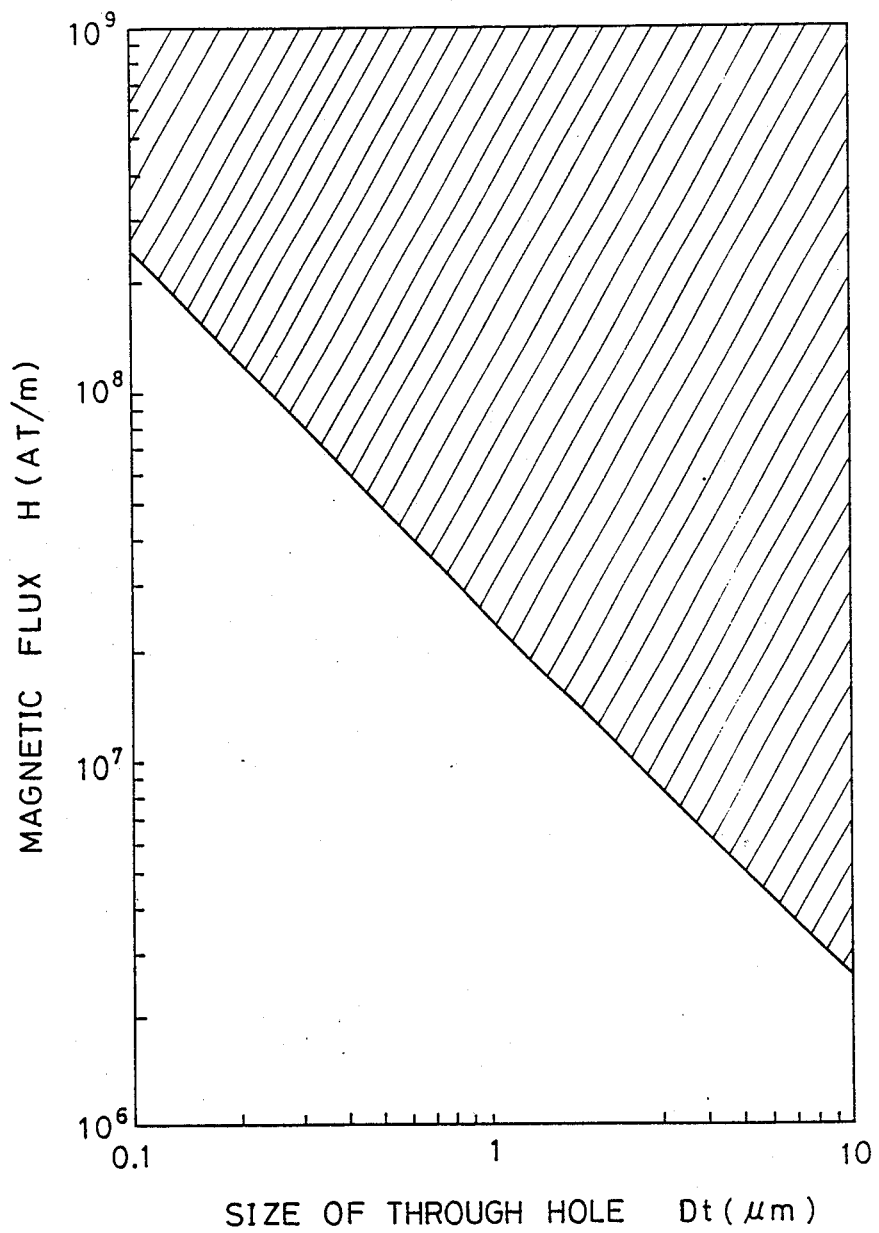
FIG. 4 is a diagram illustrating one example of the relationship between the size of a through hole and a magnetic field in the case of the observation of the bottom of the through hole.

When the magnetic field is applied to the through hole, it becomes possible to observe the secondary electron image at the bottom of the through hole. For instance, Eq. (4) when $\phi = 90°$ and E = 5eV is shown in FIG. 4. When the magnetic field H in the hatched region is applied to a through hole having a size Dt, it becomes possible to observe the secondary electron image at the bottom of the through hole.

Figure 5:
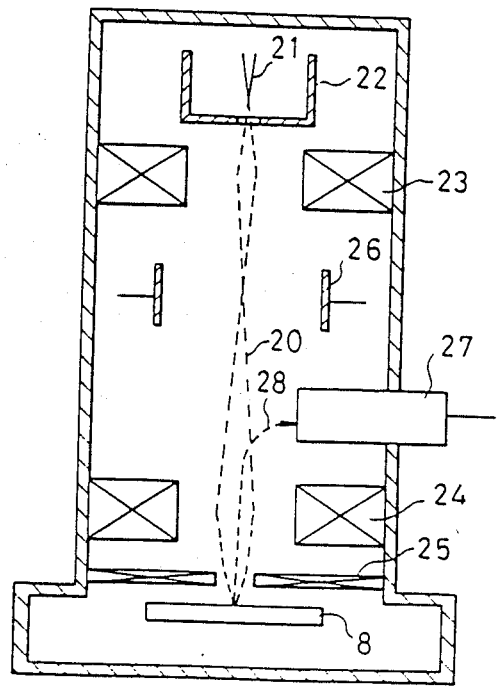
FIG. 5 is a sectional view of a preferred embodiment of an apparatus for observing a surface by utilizing a charged particle beam in accordance with the present invention.

FIG. 5 shows a column of a preferred embodiment of a charged particle beam observation apparatus in accordance with the present invention. With this apparatus, the through holes having a diameter of the order of 0.5 $\mu$m can be observed.

The primary electrons emitted from a cathode 21 are accelerated by anode 22 and focused on the surface of a specimen 8 through a condenser lens 23, a focusing lens 24, and the magnetic field produced an exciting device 25 which can apply a strong magnetic field perpendicularly to the surface of the specimen 8. The focal point on the surface of the specimen 8 can be controlled by a deflection coil 26. The secondary electrons 28 emitted from the surface of the specimen 8 pass through both the exciting device 25 and the focusing lens 24 and are detected by a secondary electron detector 27. The above-described apparatus is substantially similar to construction of the conventional apparatus except that the present invention provides the exciting device 25, so the secondary electron image of the specimen 8 can be observed by detecting the secondary electrons by the secondary electron detector 27 while scanning the surface of the specimen 8 by the primary electrons 20.

Figure 6:
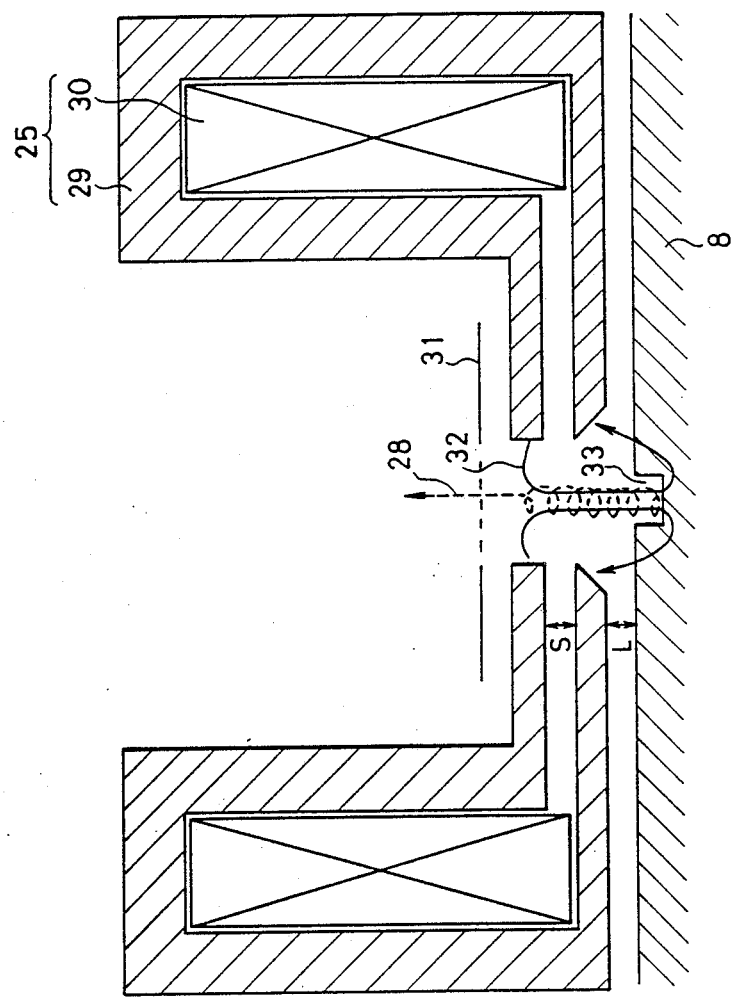
FIG. 6 is a sectional view showing an exciting device used in the preferred embodiment of the present invention.

FIG. 6 shows an example of the construction of the exciting device 25 which comprises a magnetic circuit 29 and a coil 30. Reference numeral 31 denotes an extracting electrode. Reference numeral 32 indicates lines of magnetic force produced by the exciting device 25; and reference numeral 28 indicates the secondary electrons emitted from the specimen 8. The specimen 8 is formed with a through hole 33 of the size of 0.5 μm. The radius of the coil 30 is about 1 mm and the current of $2 \times 10^5$ AT flows through the coil 30. The extracting electrode 31 is in the form of a mesh and is applied with the voltage of 1 kV.

When the exciting device 25 is constructed as described above, the magnetic field of about $1 \times 10^8$ AT/m is produced in the direction perpendicular to the surface of the specimen 8. Therefore, each secondary electron 28 emitted from the bottom of the through hole 33 moves through the through hole 33 while making the spiral motion with the Larmor radius of about 0.1 μm, and most all of the secondary electrons 28 go out of the through hole 33. The secondary electron 28 which comes out of the through hole 33 moves spirally in the direction perpendicular to the surface of the specimen 8 and is extracted to the exterior of the exciting device 25 due to the extracting electric field produced by the extracting electrode 31. As a result, most all of the secondary electrons 28 emitted from the bottom of the through hole 33 can reach the secondary electron detector 27, so that it is possible to observe the secondary electron image at the bottom of the through hole.

As described above, in the first embodiment of the apparatus for observing a surface by utilizing a charged particle beam in accordance with the present invention, the exciting device 25 is disposed in the vicinity of the specimen and the magnetic field which satisfies the condition expressed by Eq. (4) is applied to the specimen 8 so that most all of the secondary electrons emitted from the bottom of the through hole can be extracted from it. As a result, it becomes possible to observe the secondary electron image at the bottom of the through hole.

Figure 7:
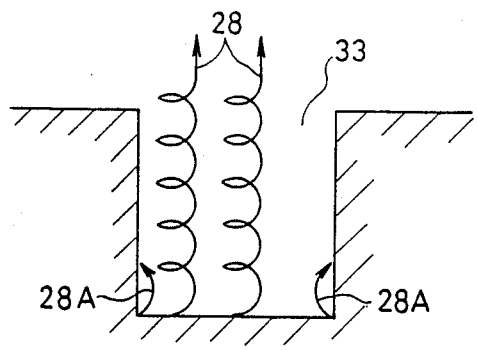
FIG. 7 illustrates the trajectories of the secondary electrons emitted from the bottom of a through hole.
Figure 8:
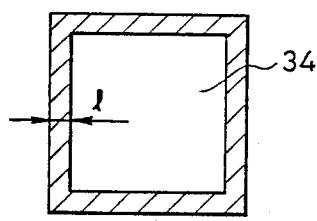
FIG. 8 is a plan view explaining a dark portion which appears in the case of the observation of a secondary electron image.
Figure 9:
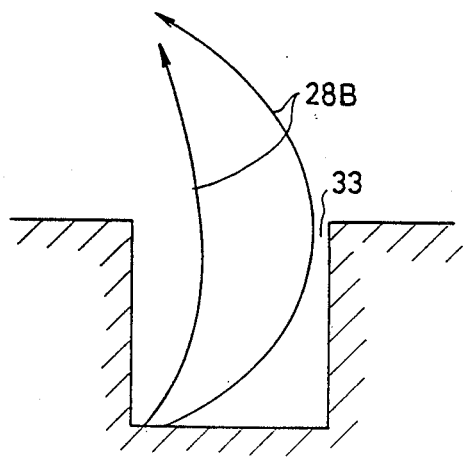
FIG. 9 shows the secondary electron trajectories which will not produce a dark portion in the case of the observation of a secondary electron image.

As shown in FIG. 7, each secondary electron 28 in spiral motion goes out of the through hole 33. However, the secondary electrons 28A emitted from the peripheral portion of the bottom of the through hole impinge on the side wall of the through hole and cannot go out of the through hole. Therefore, the image viewed through a scanning electron microscope as the image of the bottom of the through hole has a dark peripheral portion 34 of a width l as shown in FIG. 8. The width l is substantially equal to the Lamore radius of the secondary electron. It follows, therefore, that when the magnetic field produced by the exciting device is increased, the width l can be reduced. Another method for observing the whole surfaces of the bottom of through hole is to determine the magnitude of the magnetic field in such a way that the trajectories 28B of the secondary electrons become great arcs as shown in FIG. 9. In this case, the number of the secondary electrons emitted from the bottom of the through hole 33 and extracted out of the through hole 33 becomes smaller than that of the secondary electrons shown in FIG. 7, but it becomes possible to observe the whole bottom surface of the through hole.

Figure 10:
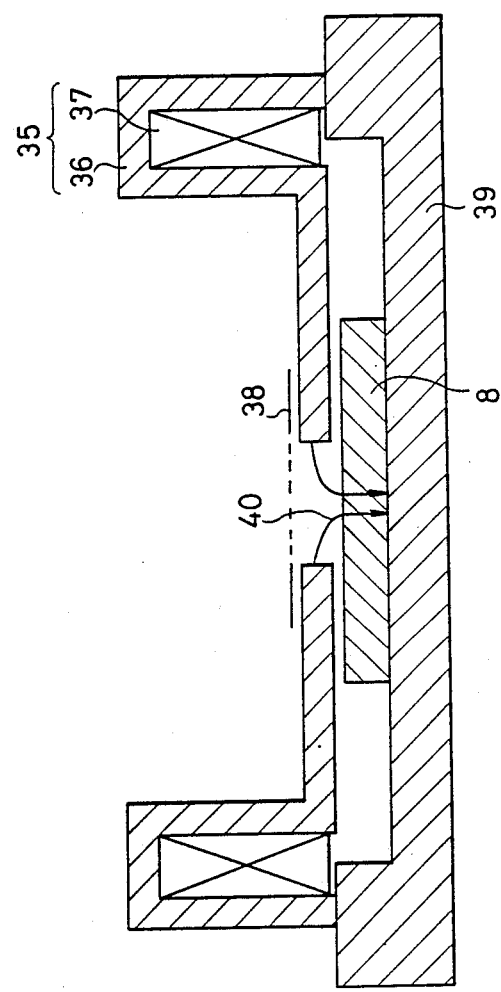
FIG. 10 is a sectional view showing another preferred embodiment of the exciting device in accordance with the present invention.
Figure 11:
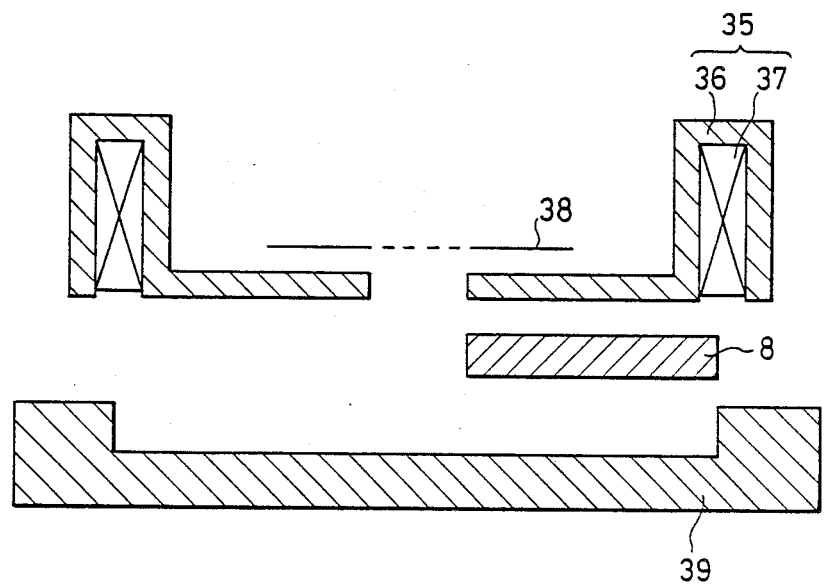
FIG. 11 is a sectional view explaining the step of replacing the specimen in the exciting device shown in FIG. 10.

FIG. 10 shows a second preferred embodiment of an apparatus for observing a surface utilizing a charged particle beam in accordance with the present invention. Only an exciting device 35 and a specimen 8 are shown in FIG. 10 and the remaining component parts are substantially same as those shown in FIG. 1. The exciting device 35 comprises a magnetic path 36 and a coil 37. Reference numeral 38 denotes an extracting electrode. A specimen stand 39 is made of a magnetic material and is vertically movable by a driving mechanism (not shown). When the current flows through the coil 37, the lines of magnetic force 40 are produced in the direction perpendicular to the specimen 8 between the magnetic path 36 and the specimen stand 39. In case of the replacement of the specimen 8, the specimen stand 39 is moved downwardly as shown in FIG. 11 and the specimen 8 is moved into or out of the space defined between the magnetic circuit 40 and the specimen stand 39. The motion of the secondary electron emitted from the through hole is substantially similar to the exciting device shown in FIG. 6.

As described above, in the second embodiment of the apparatus for observing a surface by utilizing a charged particle beam in accordance with the present invention, the specimen 8 is interposed between the specimen stand 39 made of magnetic material and the magnetic path 36 so that the magnetic field can be applied to a wide area of the specimen 8 in the direction perpendicular thereto. As a result, it becomes possible to observe the through hole in wide region of the specimen 8.

Next, the method for focusing in accordance with the apparatus for observing a surface by utilizing a charged particle beam equipped with the focusing lens and the exciting device will be described.

Prior to the description of the embodiment of the method for focusing in accordance with the present invention, the underlying principle thereof will be first described for the sake of easy understanding thereof.

Figure 1:
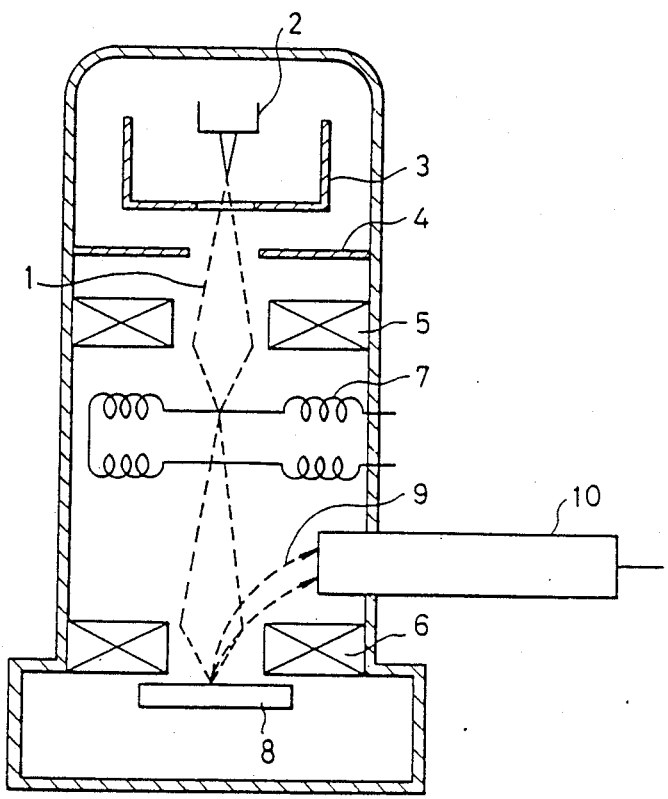
FIG. 1 is a sectional view illustrating the construction of a conventional apparatus for observing a surface utilizing charged particle beam.
Figure 2:
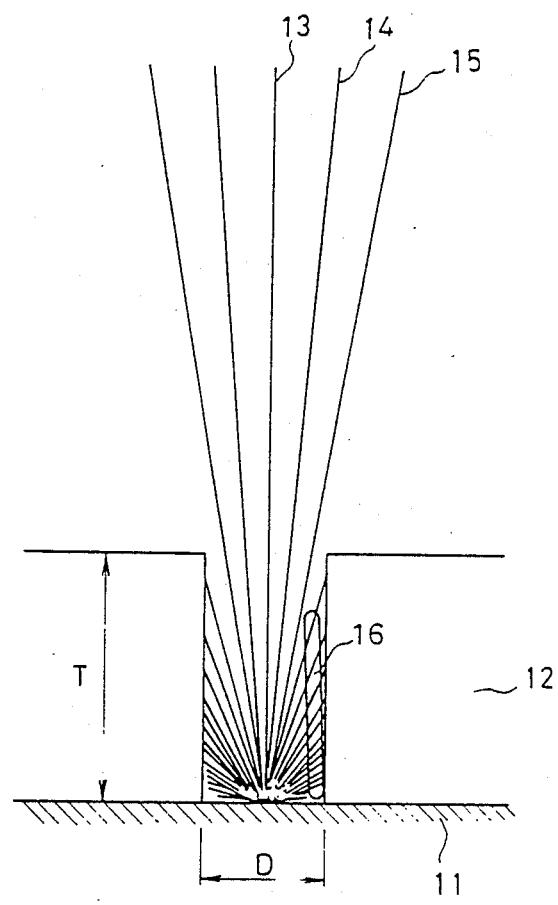
FIG. 2 shows the trajectories of electrons in a through hole in the case of a conventional apparatus.
Figure 3:
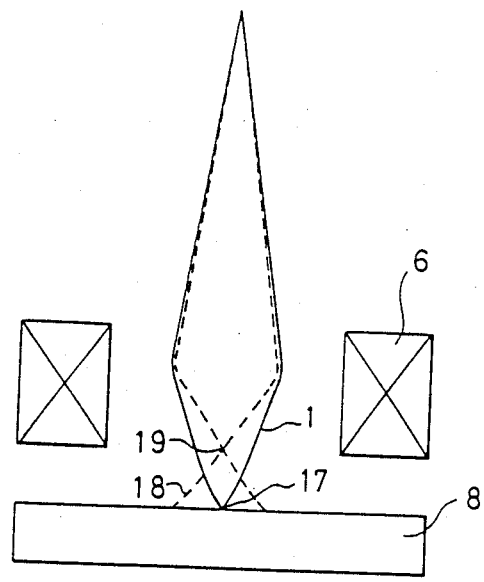
FIG. 3 shows the changes of the beam trajectories when the excitation current applied to an objective lens is increased in a conventional apparatus.
Figure 12A:
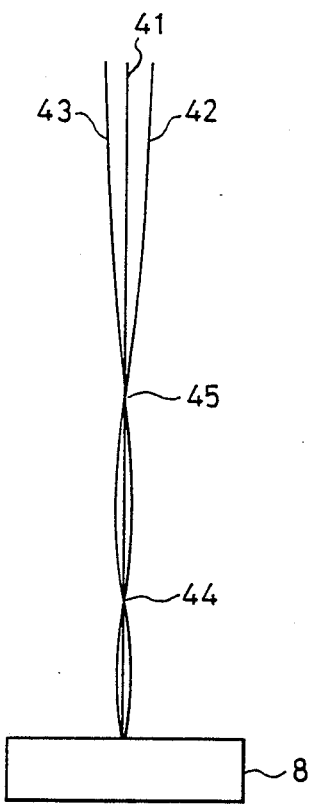
FIG. 12A shows the trajectories of electrons emitted from a specimen under the condition that a strong magnetic field is applied.
Figure 12B:
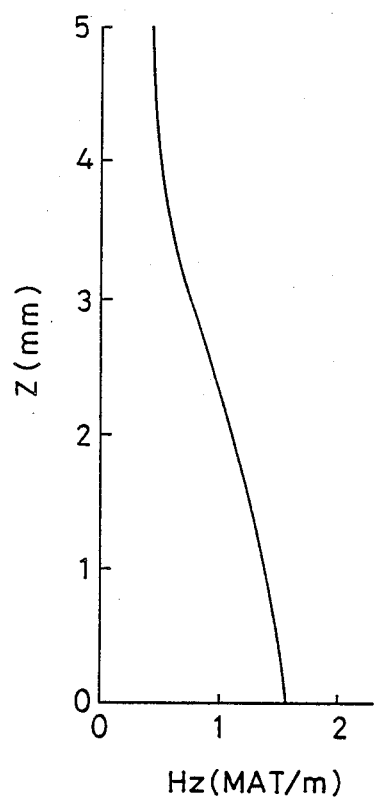
FIG. 12B illustrates the magnetic field distribution along the central axis 41 shown in FIG. 12A.

FIG. 12A shows the results obtained by the electron trajectory tracing carried out to the trajectories of the electrons emitted from the specimen placed in a rotationally symmetrical magnetic field in accordance with the electron trajectory tracing program described in "Electron Ray Tracing with High Accuracy", K. Saito, T. Okubo, K. Takamoto, Y. Uno and M. Kondo, J. Vac. Sci. Technol. A4, (4), 1913–1917 (1986). Corresponding to the following reference numerals 8 represents a specimen; 41 represents the central axis of the rotationally symmetrical magnetic field; and 42 and 43 represent trajectories of the electrons emitted from the specimen 8. Same reference numerals 42 and 43 are used to designate the electrons moving along the trajectories 42 and 43. The electrons 42 and 43 rotate about the axis 41 under the influence of the magnetic field, but in FIG. 12A, the electron trajectories are shown as viewed from the revolving coordinate system in unison with the electrons 42 and 43. Reference numerals 44 and 45 indicate the points of intersection between the electrons 42 and 43. All the electrons emitted from the upper surface of the specimen 8 at very small angles with respect to the center axis 41 pass through these points of intersection 44 and 45, which are referred to as "converging points of electrons" hereinafter in this specification. The energy of the electrons 42 and 43 is of the order of about 5 keV. FIG. 12B shows the distribution of the magnetic field along the center axis 41. In FIG. 12B, the magnetic field component Hz in the direction of the center axis 41 is plotted along the abscissa, while the positions on the center axis with respect to the upper reference surface of the specimen 8 are plotted along the ordinate as Z. The magnetic field of about $1.6 \times 10^6$ AT/m is applied to the specimen 8. The distribution of this magnetic field corresponds, for instance, to the distribution of the magnetic field along the optic axis of the objective lens 6 when the excitation current flowing through the objective lens 6 is increased in accordance with the conventional apparatus as shown in FIG. 1.

The electrons 42 and 43 emitted from the specimen 8 move upwardly of the specimen through the converging points 44 and 45. However, based upon the reciprocity law of the electron trajectory (refer to "DENSHI KOGAKU (Electron Optics)", published by Kyoritsu Publication KK, by K. Ura, in 1979, page 70), and due to reversing the direction of the magnetic field without changing its magnitude (for instance, in the conventional apparatus as shown in FIG. 1, the excitation current of the objective lens 6 is reversed), it is possible to move the electrons downwardly toward the specimen 8 along the same trajectories of the electrons 42 and 43 as shown in FIG. 12A. More particularly, when electrons having the energy of about 5 keV are irradiated from a point above the specimen in such a way that the electrons pass the converging point 45, these electrons can be focused or converged over the upper surface of the specimen 8. Although thus far the energy of the electron has been described as about 5 keV and the distribution of the magnetic field is as shown in FIG. 12B, even if the energy of the electron and the distribution of the magnetic field are varied, only the number and the positions of the converging points are varied. Therefore, when the primary electron is irradiated so as to pass the converging points, the phonomenon that the primary electron is focused on the surface of the specimen remains unchanged. When there exists a plurality of converging points, it is most simple and advantageous to pass the electrons through the furthermost converging point from the substrate.

The present invention utilizes the above-described phenomenon and comprises an exciting device capable of applying a strong magnetic field over the surface of a specimen and a focusing lens for controlling the position of the primary electron beam. The focusing lens is disposed at a position in such a way that converging points of electrons which are imaginarily emitted from the surface of the specimen and each of which has the same energy as the primary electron exist between the focusing lens and the specimen. As a result, the primary electrons are converged at the position of converging point by using this focusing lens.

Figure 13:
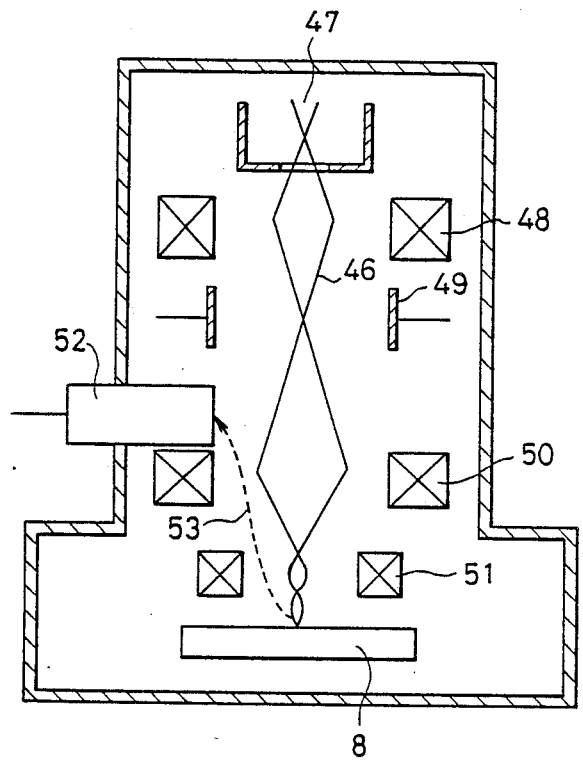
FIG. 13 is a sectional view of another embodiment of an apparatus for observing a surface by utilizing a charged particle beam according to the present invention.

FIG. 13 is a sectional view showing a third preferred embodiment of an apparatus for observing a surface by utilizing a charged particle beam in accordance with the present invention. As in the cases of the conventional apparatus, the primary electrons 46 which emitted from a cathode 47 are accelerated by an anode 48. In the third embodiment, the focusing lens 50 is a magnetic lens. The focusing lens 50 and the exciting device 51 are combined to act as an objective lens. More particularly, the function of the conventional objective lens is divided into the application of a magnetic field and the focusing, so that it becomes possible to focus in the strong magnetic field. Except for the above-described arrangement, the third embodiment of the present invention is substantially similar in construction to the conventional apparatus. The focal point of the primary electrons 46 on the surface of the substrate 8 is controlled by a deflection coil 49 and the secondary electrons 53 emitted from the surface of the specimen 8 are detected by a secondary electron detector 52, so that it becomes possible to observe the specimen 8.

Figure 14:
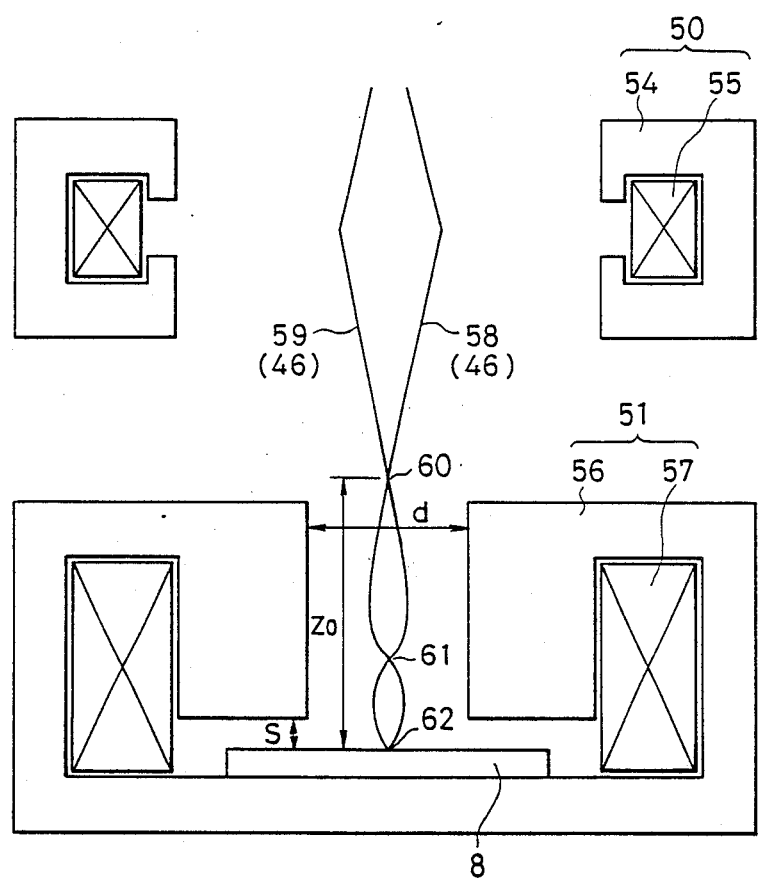
FIG. 14 is a sectional view illustrating the arrangement of a focusing lens and an exciting device and electron trajectories of an apparatus for observing a surface by utilizing a charged particle beam in accordance with the present invention.
Figure 15:
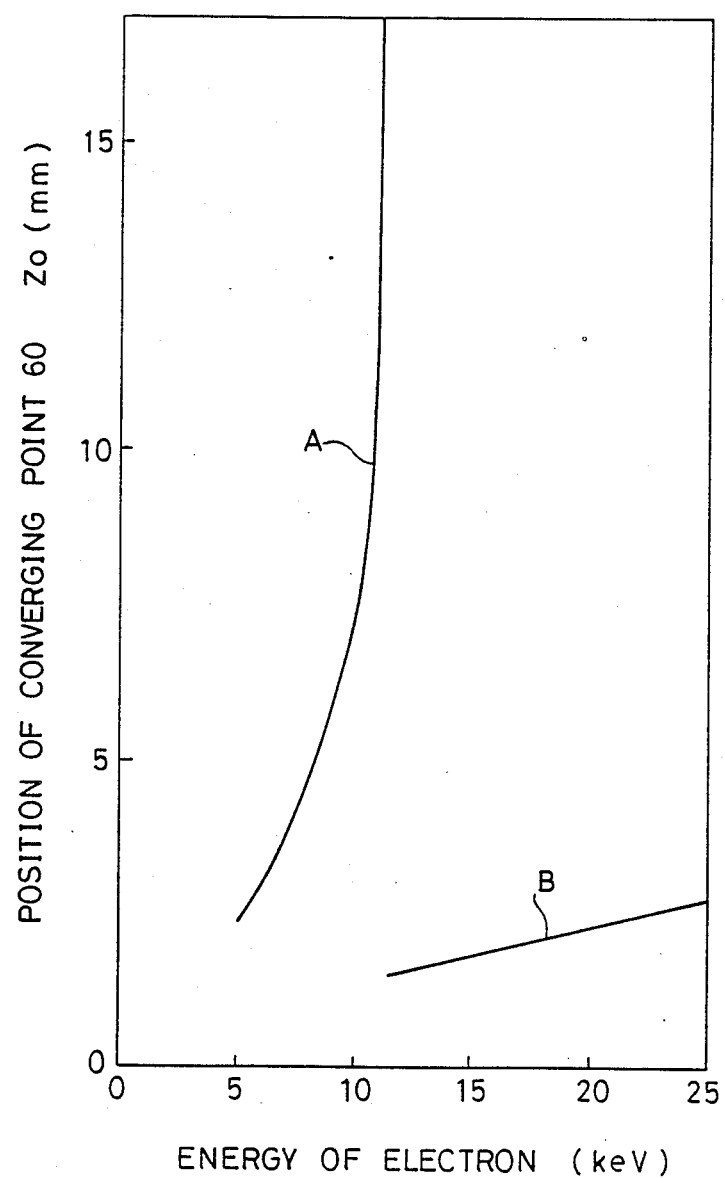
FIG. 15 is a diagram illustrating the dependence of a focusing point of the electron energy in the preferred embodiments of the present invention.
Figure 16:
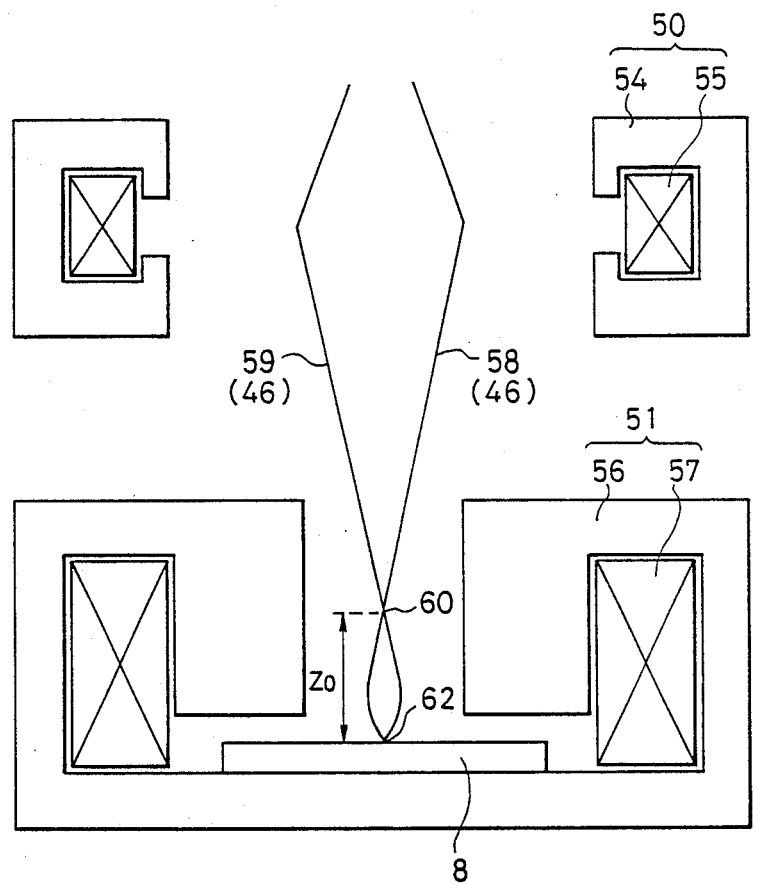
FIG. 16 is a sectional view illustrating the trajectories of electrons passing through a focusing lens and an exciting device.

FIG. 14 shows the trajectories of imaginary emitted electrons each having the same energy of each primary electron 47 emitted from the upper surface of the specimen 8. A focusing lens 50 comprises a magnetic path 54 and a coil 55. The exciting device 51 comprises a magnetic path 56 and a coil 57. A specimen 8 is mounted on the bottom of the magnetic path 56. The magnetic path 56 is about 6 mm in inner diameter d and is spaced apart from the upper surface of the specimen 8 by a distance S (about 1 mm). When the excitation current of about 10 kAT flows through the coil 57, the strong magnetic field of about $1.5 \times 10^6$ AT/m is applied to the upper surface of the specimen 8. Reference numeral 58 and 59 represent the electrons emitted from the upper surface of the specimen 8 each having the same energy as that of the primary electron. Reference numerals 60 and 61 represent converging points of the electrons 58 and 59. The positions of the converging points 60 and 61 are uniquely determined by the magnitude of the current flowing through the coil 57 and the energies of the electrons 58 and 59. FIG. 15 shows the relationship between the energies of the electrons 56 and 59 and the position $Z_0$ of the converging point 60 furthermost from the specimen obtained by the electron trajectory tracing program disclosed in the above mentioned reference report by K. Saito et al. The converging point 60 is measured from the upper surface of the specimen 8. The current flowing through the coil 57 is about 10 kAT. Except where the energies of the electrons 58 and 59 are about 11 keV, the position of the converging point 60 has a finite value. When the energies of the electrons 58 and 59 are lower than about 11 keV (corresponding to the characteristic curve A in FIG. 15), two converging points are defined as shown in FIG. 14. When the energies of the electrons 58 and 59 exceed about 11 keV (corresponding to the characteristic curve B in FIG. 15), only one converging point 62 is defined as shown in FIG. 16. In this embodiment, the focusing lens 50 is disposed in such a way that the undersurface of the magnetic path 54 is spaced apart upwardly from the upper surface of the specimen 8 by 20 mm. Therefore, under the condition that the current flowing through the coil 57 is less than about 10 kAT, at of the electron energies between 5 and 25 keV, except the values in the vicinity of about 11 keV, the converging points 60 are defined between the specimen 8 and the focusing lens 50. Therefore, when a method to be described hereinafter is used, the primary electrons 46 with the energy range between 5 and 25 keV, except the magnitudes at about 11 keV, can be focused upon the upper surface of the specimen 8.

The steps of focusing the primary electrons 46 on the upper surface of the specimen 8 are as follows:

(1) The value of the current flowing through the coil 57 and the position $Z_0$ of the converging point 60 corresponding to the energy of the primary electrons are obtained in accordance with an electron trajectory tracing program or the like. For instance, $Z_0$ depends on the value of the electron energy as shown in FIG. 15. By using the value of the current flowing through the coil 57 as a parameter, a $Z_0$ corresponding to the current flowing through the coil 57 and the energy of the primary electrons is obtained.

(2) The magnitude of the current flowing through the coil 55 is set so that the converging point of the primary electrons 46 defined in the lens field coincides with the position of $Z_0$ obtained in (1).

(3) In order to obtain a sharp secondary electron image, the value predetermined in (2) is used as an initial value and then the current flowing through the coil 55 is finely adjusted.

As a result, the primary electrons pass the converging points 60 and 61 in the order named and are focused on the position 62 on the surface of the specimen 8.

Figures 17, 18:
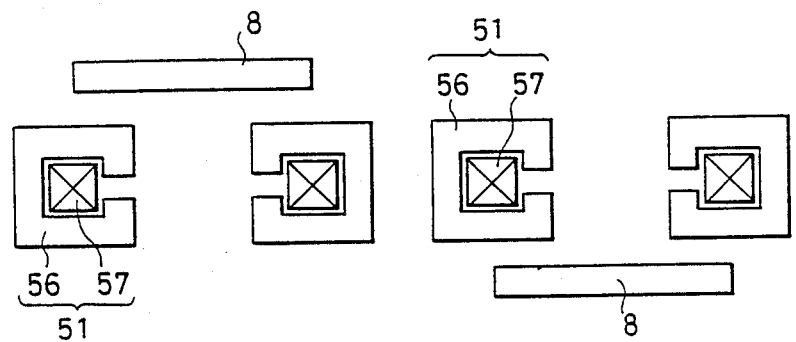
FIGS. 17 and 18 are plan views showing the positional relationship between the exciting device and the specimen in each of the preferred embodiments of the present invention.

So far it has been described that one or two converging points of the electrons exist, but it is apparent that the present invention may be equally applied to the case in which the converging points are three or more. Furthermore, the specimen has been described as being mounted on the magnetic path forming the exciting device, but it is also apparent that the present invention may be equally applied even through the specimen 8 is placed above or below the exciting device 51 as shown in FIGS. 17 and 18. FIG. 17 shows that the specimen 8 is disposed above the exciting device 51, while FIG. 18 shows that the specimen 8 is placed below the exciting device 51.

In addition, when the focusing method in accordance with the present invention is applied to the apparatus for observing a surface by utilizing a charged particle beam in which the column can be controlled by a computer, the automatic focusing can be accomplished by the computer.

Figure 19:
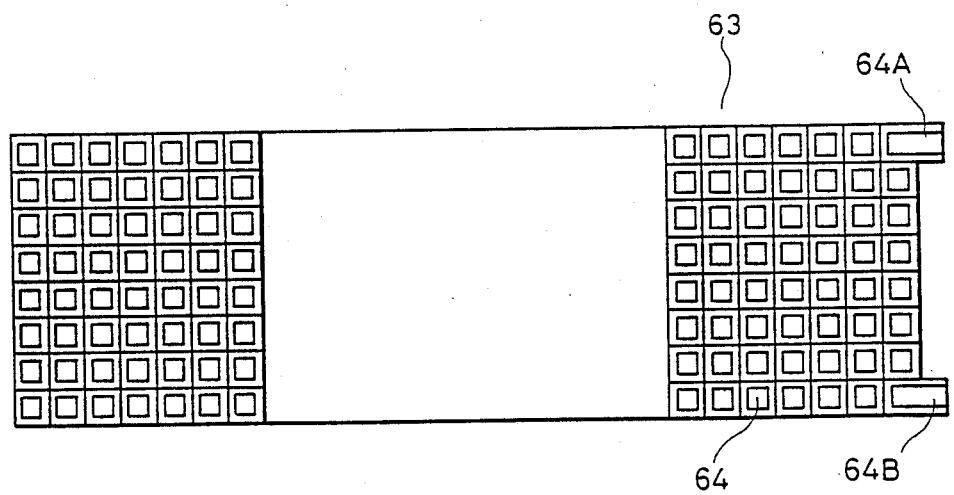
FIG. 19 is a sectional view of a coil in an exciting device in accordance with the present invention.

FIG. 19 shows a sectional view of a coil constructing an exciting device. The coil 63 is made by winding an insulated copper pipe 64 whose exterior surface is coated with an epoxy resin. The tube 64 has an outer square cross section with the sides of 5 mm and an inner square cross section with the sides of 3 mm. In this embodiment, the cooling water at the pressure of 2 kg/cm$^2$ is injected into the pipe through a inlet port 64A. The water flows through the pipe 64 and is discharged from a discharge port 48. In this case, the heat generated from the pipe is dissipated to the exterior of the pipe through the water flowing therethrough, so that the temperature rise of the coil can be reduced.

Figure 20:
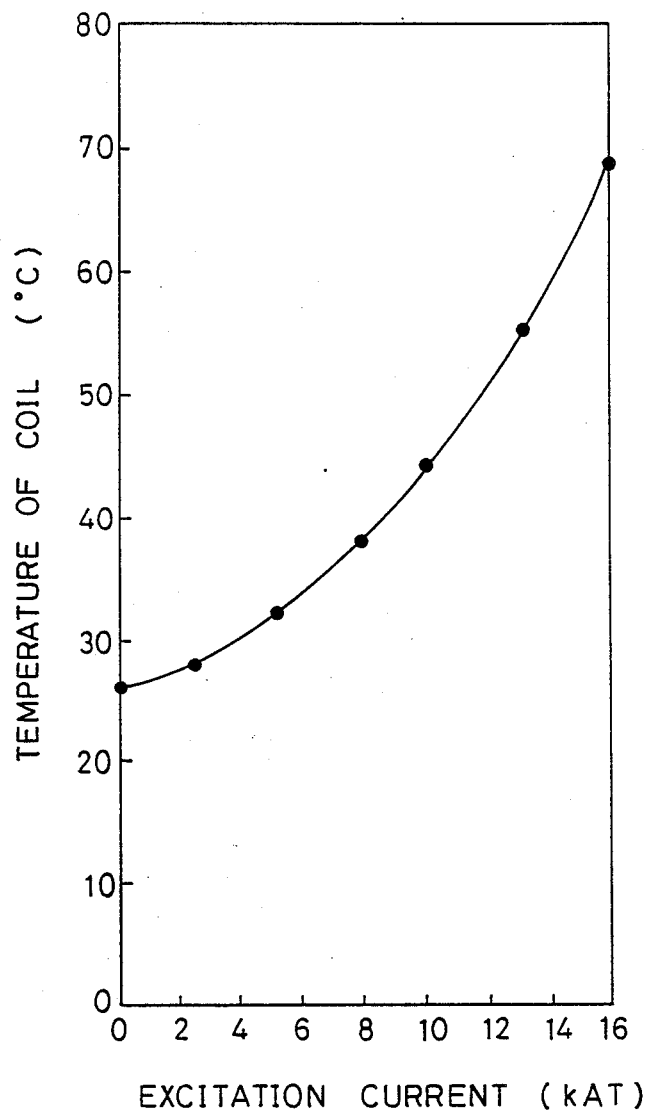
FIG. 20 is a diagram illustrating the relationship between the excitation current and the coil temperature when a water-cool coil is used.

FIG. 20 shows the dependence of the coil temperature on the excitation current experimentally obtained by using the above-described coil. When the excitation current is 16000 AT, the temperature of the coil of the objective lens in the conventional apparatus rises higher than 100° C., while the temperature of the coil in accordance with the present invention is 70° C. Therefore, in the apparatus for observing a surface by utilizing a charged particle beam in accordance with the present invention, accidents such as the breakdown of the insulator and the like can be prevented, so that the stable operation of the apparatus can be ensured.

A cooling medium which flows through the coil may not be only water, but may also include liquefied nitrogen. The cross sectional configuration of the pipe is not limited to a square and may be rectangular, circular or the like. The pipe may be made of aluminum or any other suitable conductor instead of copper and it suffices that the surface of a pipe is insulated.

Figure 21:
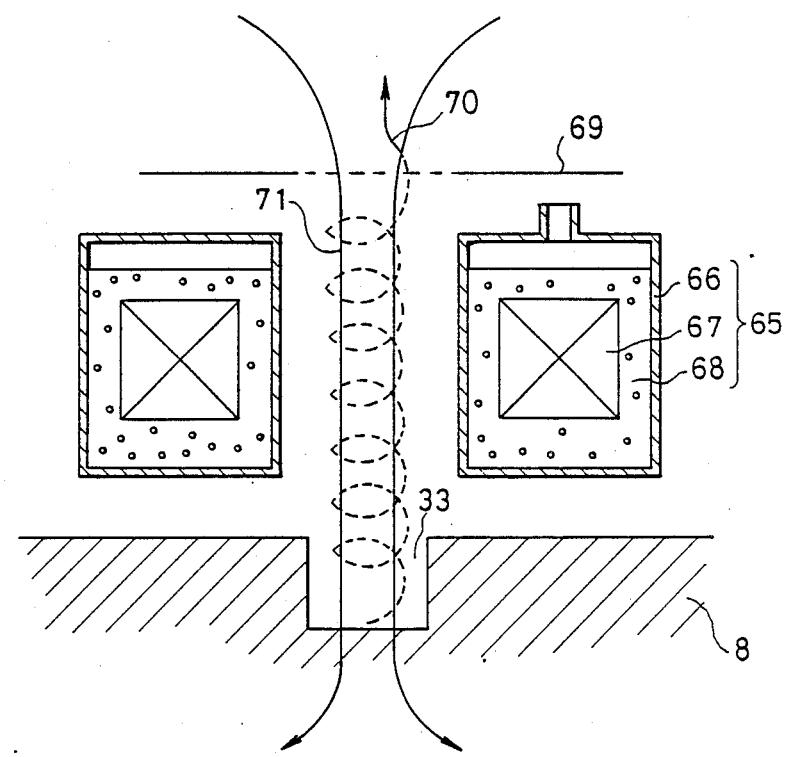
FIGS. 21-23 are sectional views of the exciting devices, respectively, used in the present invention.

FIG. 21 shows another embodiment of the exciting device in accordance with the present invention. The exciting device 65 uses a superconducting pipe. More particularly, a superconducting coil 67 is disposed within a thermal-insulating container 66 and is cooled by a cooling medium 68 such as liquefied nitrogen. Reference numeral 69 represents an extracting electrode. By the superconducting coil 67, a high magnetic field exceeds $10^7$ AT/m or more can be applied to the surface of the specimen 8. Consequently, the secondary electrons 70 emitted from the bottom of the through hole 33 can go out therefrom in spiral motion along a line of magnetic force 71 perpendicular to the surface of the specimen.

Figure 22:
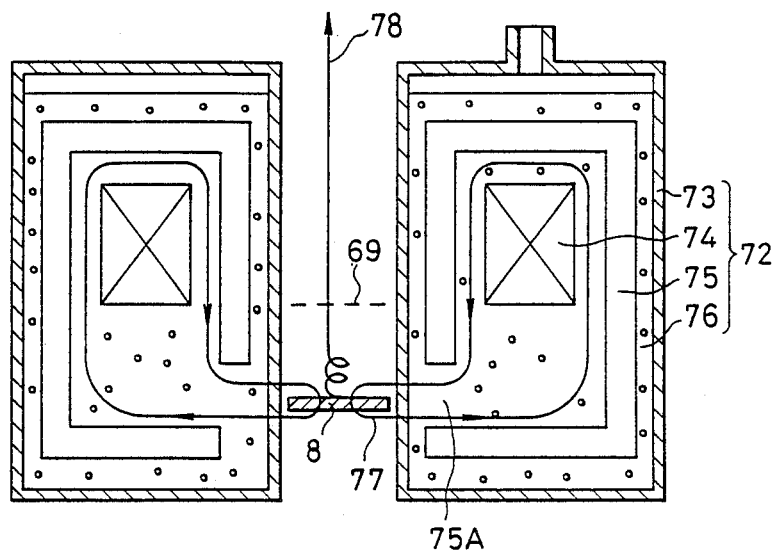

FIG. 22 shows a further embodiment of the exciting device in accordance with the present invention. The exciting device 72 comprises a thermal-insulating container 73, a superconducting coil 74, a casing 75 which is made of a superconductive material as niobium alloy and encloses the superconducting coil 74 and a cooling medium 76. The casing 75 is formed with an air gap 75A only at a position in opposition to the specimen 8. The magnetic field produced by the superconducting coil 74 leaks to the exterior of the casing 75 only through the air gap 75A, so that the strong magnetic field can be applied to a narrow portion in the vicinity of the specimen. Reference numeral 77 designates lines of magnetic force; and 78, the trajectory of the secondary electrons in FIG. 22.

Figure 23:
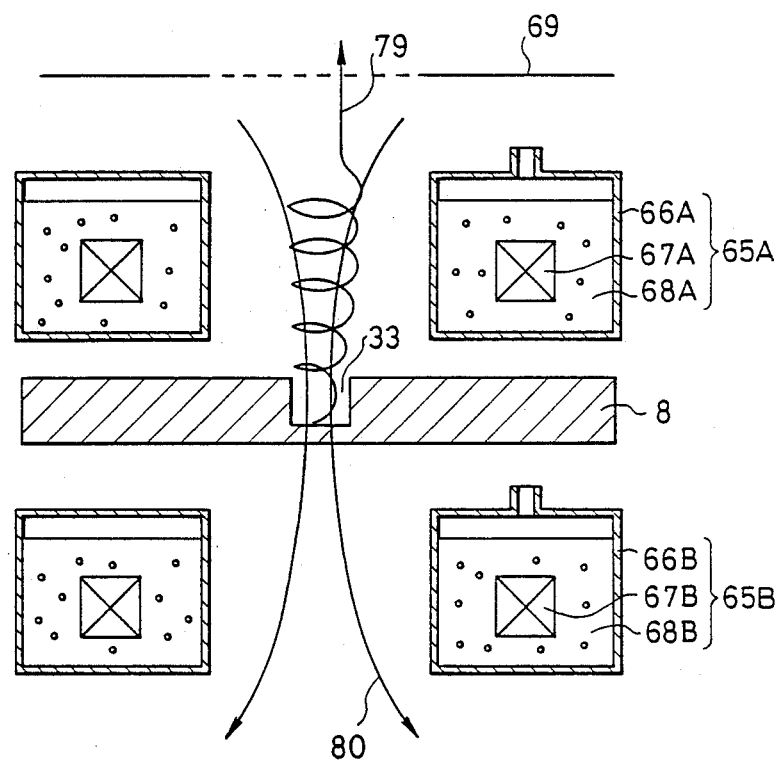

The exciting device shown in FIG. 23 comprises two exciting devices 65A and 65B. Like the exciting device 65 shown in FIG. 21, each of the exciting device 65A or 65B comprises a thermal-insulating container 66A or 66B, a superconducting coil 67A or 67B and a cooling medium 68A or 68B. The exciting device 65A is disposed above the specimen, while the exciting device 65B is disposed below the specimen 8. When two exciting devices are arranged as described above, a strong magnetic field exceeds more than $10^7$ AT/m can be applied to a wide range. As a consequence, the secondary electrons 79 emitted from the bottoms of the through holes 33 formed in a wide area of the specimen 8 can be extracted out of the through hole 33 in spiral motion along lines of magnetic force 80.

In the above embodiments, it is described that the charged particles which are focused are electrons, but it is apparent that the present invention may be equally applied to other charged particles such as charged gallium ions or the like instead of electrons. Furthermore, the focusing lens has been described as consisting of a magnetic field lens, but an electrostatic lens can be also used in the present invention. In the latter case, however, the position of the converging point of the primary electrons is controlled by a voltage applied to the electrostatic lens. In addition, the extracting electrode has been so far described as being in the form of a mesh, but other extracting electrodes not in the form of a mesh such as perforated metal sheet may be used. When the primary beam is converged by an acceleration type Einzel lens, an electric field for extracting of the secondary electrons is applied to the surface of the specimen so that the extracting electrode can be eliminated. Moreover, so far the exciting device has been described as consisting of the magnetic path and the coil, but it may be composed of other means such as a permanent magnet or the like.

The size of the through hole is not limited to those described in the above embodiments. As Eq. (4) is held, a magnetic field to be applied to the specimen may be determined according to the size of a through hole. Furthermore, the present invention can be applied to the case that the electrons obliquely irradiate for the bottom of a through hole so as to observe the side surface of a through hole.

The superconducting coil and the casing enclosing the coil therein of the exciting device are made of various superconductive materials such as niobium-series alloyed superconductive materials, oxide superconductive materials and the like. The cooling medium is selected depending upon a superconducting material to be used.

INDUSTRIAL APPLICABILITY

As described above, in the apparatus for observing a surface by utilizing a charged particle beam in accordance with the present invention, the exciting device for producing a strong magnetic field in the vicinity of the specimen so that the strong magnetic field is applied to the specimen. Therefore, almost all the secondary electrons emitted from the bottom of a through hole can be extracted out of the through hole along the lines of magnetic force. In addition, according the focusing method of the present invention, even when the strong magnetic field is applied to the specimen, the primary electrons can be converged at a point over the surface of the specimen. Accordingly, under the strong magnetic field, the secondary electron image on the surface of the specimen can be sharply observed. Thus, the present invention can be advantageously applied to the through-hole inspection step in the process of the production of fine MOSLSIs.

We claim:

1. An apparatus for observing a surface using a charged particle beam comprising:
   a charged particle gun for emitting primary charged particles;
   a charged particle beam irradiation trajectory control unit for irradiating a specimen with said charged particle beam and scanning the same;
   a secondary electron detector for detecting secondary electrons emitted from said specimen in response to the irradiation of said specimen by said charged particle beam;
   a focusing lens for controlling a position at which said primary charged particles are converged; and
   an exciting device, provided between said specimen and said focusing lens, for producing a strong magnetic field over the surface of said specimen such that said secondary electrons are emitted in a spiral motion from recesses in the surface.

2. An apparatus for observing a surface by utilizing a charged particle beam as claimed in claim 1, wherein said primary charged particles are electrons.

3. An apparatus as claimed in claim 1, wherein said exciting device applies a strong magnetic field to the surface of said specimen in a direction in which lines of magnetic force intersect a bottom surface or a side surface of a recess in said surface of said specimen such that said secondary electrons emitted from said bottom or said side surface of said recess make a spiral motion out of said recess along the strong magnetic field.

4. An apparatus for observing a surface by utilizing a charged particle beam as claimed in claim 1, wherein said exciting device comprises a coil and a magnetic path.

5. An apparatus for observing a surface by utilizing a charged particle beam as claimed in claim 4, wherein said coil is cooled by a cooling medium.

6. An apparatus as claimed in claim 4, wherein said specimen is mounted on said magnetic path.

7. An apparatus as claimed in claim 4, wherein said focusing lens comprises a coil and magnetic path.

8. An apparatus for observing a surface by utilizing a charged particle beam as claimed in claim 1, wherein said exciting device comprises a superconducting coil.

9. An apparatus for observing a surface by utilizing a charged particle beam as claimed in claim 8, wherein said superconducting coil is made of a superconducting material and is enclosed in a casing made of a superconducting material having an air gap at a position in an opposing relationship with said specimen.

10. An apparatus for observing a surface by utilizing a charged particle beam as claimed in claim 8, wherein said exciting device further comprises another superconducting coil disposed under said specimen.

11. An apparatus for observing a surface by utilizing a charged particle beam as claimed in claim 1, wherein said focusing lens is disposed such that when charged particles, each having energy equal that of said primary charged particles are imaginarily emitted from the surface of said specimen, converging points of said charged particles are defined between said focusing lens and said specimen.

12. An apparatus as claimed in claim 1, wherein said exciting device is disposed near said specimen.

13. An apparatus as claimed in claim 1, wherein said strong magnetic field has an intensity of at least $1.5 \times 10^6$ AT/m.

14. An apparatus as claimed in claim 1, wherein said specimen is mounted on a specimen stand made of magnetic material.

15. An apparatus as claimed in claim 1 further comprising a computer means for automatically adjusting the position at which said primary charge particles are converged.

16. An apparatus for observing a surface using a charged particle beam comprising:
   emitting means for emitting primary charged particles;
   accelerating means for accelerating said primary charged particles toward a specimen;
   a deflection coil for controlling a focal point of said primary charged particles on said specimen;
   focusing means for focusing said primary charged particles on to a surface of said specimen;
   exciting means for additionally focusing said primary charged particles on to the surface of said specimen and for producing a strong magnetic field over the surface of said specimen such that secondary electrons emitted from a recess in the surface of said specimen make a spiral motion out of said recess along the strong magnetic field; and
   a secondary electron detector for detecting secondary electrons from said specimen.

17. An apparatus as claimed in claim 16 further comprising a computer means for controlling said focusing lens and said exciting means to focus automatically said primary charged particles onto said specimen.

18. An apparatus as claimed in claim 17 wherein:
   said focusing means comprises a first coil and a first magnetic path;
   said exciting means comprises a second coil and a second magnetic path; and
   said computer means controls one of a current and voltage in the first coil of said focusing means and the second coil of said exciting means to focus automatically said primary charged particles onto said specimen.

19. A method for observing a surface by using a charged particle beam comprising the steps of:
   irradiating primary charged particles to a surface of a specimen;
   applying a strong magnetic field in a direction in which lines of magnetic force intersect a bottom surface or a side surface of a recess in the surface of said specimen;

emitting secondary electrons from the recess in the surface of said specimen in a spiral motion along the strong magnetic field; and detecting said emitted secondary electrons, thereby observing the surface of said specimen including the recess.

20. A method according to claim 19, further comprising the steps of:

obtaining positions of imaginary converging points on which charged particles, each having energy equal to said primary charged particles, converge when imaginarily emitted from the surface of said specimen;

selecting automatically a value of one of an excitation current and a voltage to converge said charged particles at said imaginary converging points; and adjusting said value to converge precisely said primary charged particles at said imaginary converging points;

thereby focusing said primary charged particles onto the surface of said specimen.

21. A method according to claim 19, further comprising the step of scanning the entire surface of said specimen with said charged particle beam.

22. A method for observing a surface by using a charged particle beam comprising the steps of:

irradiating primary charged particles over a surface of a specimen;

obtaining positions of imaginary converging points on which charged particles, each having energy equal to said primary charged particles, converge when imaginarily emitted from the surface of said specimen;

selecting automatically a value of one of an excitation current and a voltage to converge said charged particles at said imaginary converging points;

adjusting said value to converge precisely said primary charged particles at said imaginary converging points;

applying a strong magnetic field in a direction in which lines of magnetic force intersect a bottom surface or a side surface of a recess in the surface of said specimen;

emitting secondary electrons from the recess in the surface of said specimen in a spiral motion along the strong magnetic field; and detecting said emitted secondary electrons at said imaginary converging points, thereby observing the surface of said specimen including the recess.

23. A method for observing a surface by using a charged particle beam comprising the steps of:

irradiating primary charged particles;

focusing said primary charged particles on to a specimen;

controlling a focal point of said primary charged particles on said specimen;

applying a strong magnetic field in a direction in which lines of magnetic force intersect a bottom surface or a side surface of a recess in the surface of said specimen;

emitting secondary electrons from the recess in the surface of said specimen in a spiral motion along the strong magnetic field; and detecting said emitted secondary electrons, thereby observing the surface of said specimen including the recess.

* * * * *